(12) United States Patent
Shimizu

(10) Patent No.: US 6,570,198 B2
(45) Date of Patent: May 27, 2003

(54) LINEAR IMAGE SENSOR INTEGRATED CIRCUIT

(75) Inventor: Tooru Shimizu, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/966,720

(22) Filed: Sep. 27, 2001

(65) Prior Publication Data

US 2002/0084469 A1 Jul. 4, 2002

(30) Foreign Application Priority Data

Oct. 20, 2000 (JP) ........................... 2000-321324

(51) Int. Cl.⁷ ..................... H01L 27/148; H01L 29/768
(52) U.S. Cl. ................ 257/234; 257/222; 257/290; 257/431; 257/435; 257/797; 438/48; 438/401; 438/462; 438/975
(58) Field of Search ................... 257/222, 226, 257/234, 797, 617, 369, 431, 462, 443, 465, 290, 513, 291, 294, 435, 292; 438/48, 401, 462, 975

(56) References Cited

U.S. PATENT DOCUMENTS

| 5,635,738 A | * | 6/1997 | Shoda et al. | 257/225 |
| 5,672,906 A | * | 9/1997 | Saito et al. | 257/617 |
| 5,677,248 A | * | 10/1997 | Sakai et al. | 438/462 |

* cited by examiner

*Primary Examiner*—David Nelms
*Assistant Examiner*—Andy Huynh
(74) *Attorney, Agent, or Firm*—Adams & Wilks

(57) ABSTRACT

A linear image sensor integrated circuit has a semiconductor substrate having a pixel region and a scribe region adjacent to the pixel region. A diffusion layer is disposed in the pixel region of the semiconductor substrate. A PN junction is formed between the semiconductor substrate and the diffusion layer for receiving light. A passivation film covers the PN junction and is disposed over a surface of the semiconductor substrate except for a portion of the surface thereof in the scribe region.

9 Claims, 1 Drawing Sheet

LINEAR IMAGE SENSOR INTEGRATED CIRCUIT

BACKGROUND OF THE INVENTION

1. Field of the Invention

The present invention relates to a linear image sensor IC suitable for a facsimile machine, an image scanner, or the like for reading and transmitting image information, and to a semiconductor device having the linear image sensor IC.

2. Description of the Related Art

In an image sensor, a PN junction is used as a photoelectric conversion device. FIG. 3 is a sectional view illustrating a pixel portion of a conventional image sensor. A PN junction between an N type silicon substrate 1 and a pixel P type diffusion layer 2 is used as a photoelectric conversion device. Light enters a pixel region 10 and impinges on silicon lattice to generate minority carriers. The minority carriers move in the N type silicon substrate 1 and reach the pixel P type diffusion layer 2 to be photoelectrically converted.

By absorbing minority carriers generated in the silicon substrate 1 except the pixel region 10 with a guard ring 8 which is a P type diffusion layer formed so as to surround the pixel region 10, only light which enters the pixel region 10 can be sensed. When the pixel region 10 is adjacent to an edge of a chip, the minority carriers coming from that direction is ignorable and thus, the guard ring 8 can be omitted with regard to that direction. Further a scribe region 11 has an isolation 3 on the substrate 1 and a passivation 4 on the isolation 3. A wire 5 is disposed on the isolation 3 and is connected to the pixel P type diffusion layer 2 and the passivation 4.

However, an image sensor structured as above has a problem in that its characteristics when the sensor is on a wafer are different from those when it becomes a finished product. This is due to difference in the amount of the minority carriers in the respective pixel areas caused by special structures such as an alignment mark on scribe regions or structures of peripheral circuits for adjacent chips.

SUMMARY OF THE INVENTION

In order to solve the above problem, according to an aspect of the present invention, a linear image sensor IC is structured as in the following. A linear image sensor IC having no guard ring PN junction between a PN junction for receiving light and an adjacent scribe region is structured such that a silicon substrate surface retaining a silicon substrate impurity concentration appears in the scribe region. Alternatively, a linear image sensor IC is structured such that the scribe region forms a PN junction of a silicon substrate impurity concentration, the PN junction being given no electric potential.

According to another aspect of the present invention, a semiconductor wafer having a linear image sensor IC arranged on a surface thereof, the linear image sensor IC having a PN junction for receiving light and a guard ring spaced from the PN junction, further comprises a scribe region adjacent to the linear image sensor IC on a side opposite to a side of the guard ring, the scribe region having a surface impurity concentration equal to a substrate impurity concentration of the semiconductor wafer. Further, a PN junction of a substrate impurity concentration of the semiconductor wafer is arranged in the scribe region.

DETAILED DESCRIPTION OF THE PREFERRED EMBODIMENTS

The present invention is now described with reference to the drawings.

Figure 1:
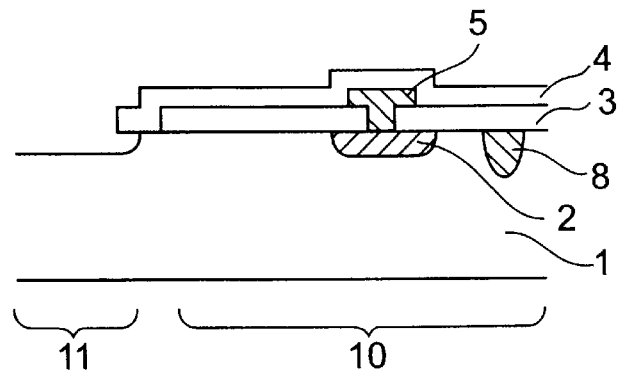
FIG. 1 is a sectional view of a pixel region and a scribe region of an image sensor according to a first embodiment of the present invention.

FIG. 1 is a sectional view of a pixel region and a scribe region of an image sensor according to a first embodiment of the present invention. A PN junction formed between an N type silicon substrate 1 and a pixel P type diffusion layer 2 in the N type silicon substrate 1 carriers out photoelectric conversion. No guard ring 8 exists between the PN junction and a scribe region 11. The scribe region 11 is adjacent to a pixel region 10 through the N type silicon substrate 1 only. The N type silicon substrate 1 as it is appears on a surface of the scribe region 11. The guard ring 8 is formed in the surface of the substrate 1, separate from the diffusion layer 2 in the direction against the scribe region 11. There is also an isolation film 3 (hereinafter referred to as "isolation"), a wire 5 on the isolation 3 and connected to diffusion layer 2, and passivation film 4 (hereinafter referred to as "passivation") disposed on the isolation 3.

The impurity concentration of the surface is the same as that in the silicon substrate 1. Surface roughness to some extent is observed on the surface because the silicon substrate is etched during contact etching, metal etching, and passivation etching.

The concentration on the surface of the scribe region is the same as that in the substrate. Therefore, it becomes easier for minority carriers in the substrate to reach the surface of the scribe region. Further, since the surface is exposed as it is to the atmosphere, recombination at the surface occurs more remarkably, and thus, the minority carriers disappear more easily. Excess minority carriers generated in the scribe region 11 and in adjacent chips move to the surface in the scribe region 11 and disappear due to the recombination of the surface, and thus, do not flow in the pixel region 10. Even in a finished product, by dicing along the scribe region 11, the surface thereof is formed into the silicon substrate exposed to the atmosphere with the impurity concentration almost same as that in the silicon substrate. As a result, there is almost no difference between the characteristics of the image sensor when the sensor is on a wafer and those when the sensor becomes a finished product, and thus, characteristic inspection of a finished product can be carried out when the image sensor is still on a wafer.

Figure 2:
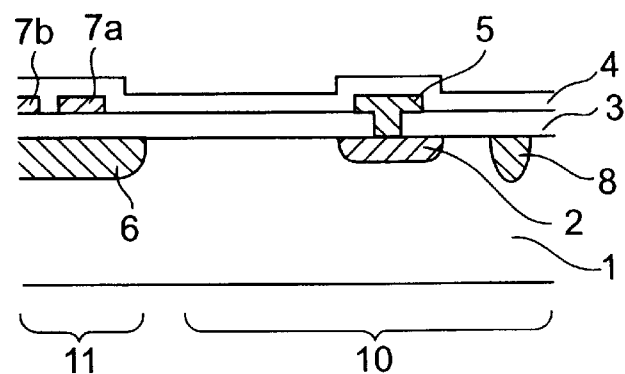
FIG. 2 is a sectional view of a pixel region and a scribe region of an image sensor according to a second embodiment of the present invention.
Figure 3:
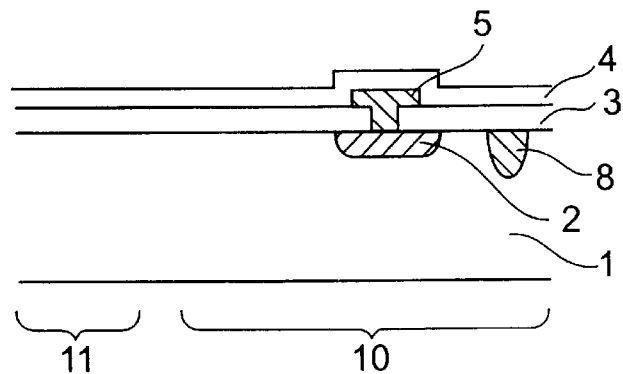
FIG. 3 is a sectional view of a pixel region and a scribe region of a conventional image sensor.

FIG. 2 is a sectional view of a pixel region and a scribe region of an image snesor according to a second embodiment of the present invention. A PN junction formed between an N type silicon substrate 1 and a pixel P type diffusion layer 2 in the N type silicon substrate 1 carriers out photoelectric conversion. No guard ring 8 exists between the PN junction and a scribe region 11. The scribe region 11 is adjacent to a pixel region 10 through the N type silicon substrate 1 only. The guard ring 8 is formed in the surface of the substrate 1, separate from the diffusion layer 2 in the direction against the scribe region 11. There is also an isolation 3, a wire 5 on the isolation 3 and connected to diffusion layer 2, and a passivation 4 on the isolation 3. A scribe P type diffusion layer 6 is formed over the whole surface of the scribe region. A PN junction is formed between the scribe P type diffusion layer 6 and the N type silicon substrate 1. No direct electric potential is given to the scribe P type diffusion layer 6, and its electric potential is through the N type silicon substrate 1.

Minority carriers in the substrate in the scribe region 11 easily reach the PN junction, and thus, are easily absorbed in the scribe P type diffusion layer 6. Excess minority carriers generated in the scribe region 11 and in adjacent chips are absorbed in the PN junction surface in the scribe region, and thus, do not flow in the pixel region 10. Therefore, there is almost no difference between the characteristics of the image sensor when it is on a wafer and those when it becomes a finished product, and thus, characteristic inspection of a finished product can be carried out when the image sensor is still on a wafer. In such a structure, the effect can be obtained only by forming a P type diffusion layer under any surface structure without limitation on the surface of the scribe region 11 of Embodiment 1, and thus, the present embodiment is particularly useful when, for example, structures such as alignment marks 7a,7b on the scribe region 11 are required to be planarized.

No electric potential is given to the scribe P type diffusion layer 6 for the purpose of suppressing unstable leak which may be caused by the PN junction on a diced surface. The scribe P type diffusion layer 6 can be formed as a P well diffusion layer or a P type channel stop layer in a typical CMOS manufacturing process without increasing the number of manufacturing steps.

Further, the structures of Embodiments 1 and 2 may be used together, i.e., the structure of Embodiment 1 may be used in a scribe region with no particular structure arranged therein, while the structure of Embodiment 2 may be used in a scribe region with an alignment mark or the like arranged therein.

As described in the above, according to the present invention, a CMOS linear image sensor which has small difference between characteristics inspected when it is on a wafer and those when it becomes a finished product, which does not require a guard ring, and the chip size of which is small can be provided.

What is claimed is:

1. A semiconductor device comprising: a plurality of linear image sensor integrated circuits having a first conductivity type silicon substrate and each having a PN junction formed on the first conductivity type silicon substrate for receiving light, and a passivation film covering the PN junction; and a scribe region disposed between the linear image sensor integrated circuits and spaced-apart from the PN junction so that the passivation film is not disposed over the scribe region.

2. A semiconductor device comprising: a plurality of linear image sensor integrated circuits having a first conductivity type silicon substrate and each having a primary PN junction formed on the first conductivity type silicon substrate for receiving light, and a passivation film covering the primary PN junction; a scribe region disposed between the linear image sensor integrated circuits and spaced-apart from the primary PN junction; and each linear image sensor integrated circuit having a secondary PN junction which does not receive an electric potential, the secondary PN junction having a second conductivity type impurity diffusion layer disposed in the scribe region.

3. A semiconductor device comprising: a semiconductor wafer having a linear image sensor integrated circuit disposed on a surface thereof and a scribe region adjacent to the linear image sensor integrated circuit, the linear image sensor integrated circuit having a PN junction for receiving light and a guard ring spaced from the PN junction, the scribe region being disposed on a side of the semiconductor wafer opposite to a side on which the guard ring is disposed, and a portion of the surface of the semiconductor wafer disposed in the scribe region being etched so that an impurity concentration of the scribe region is equal to an impurity concentration of the semiconductor wafer.

4. An image sensor integrated circuit comprising:
a scribe region having a first conductivity type semiconductor substrate, a second conductivity type diffusion region disposed in the surface of the semiconductor substrate, an isolation film disposed on the second conductivity type diffusion region, an alignment mark disposed on a surface of the isolation film, and a passivation film disposed on the alignment mark; and
a pixel region having the semiconductor substrate, the isolation film, the passivation film, a pixel second conductivity type diffusion region disposed in the surface of the semiconductor substrate, a guard ring disposed in the surface of the semiconductor substrate and spaced-apart from the pixel second conductivity type diffusion region, and a wire disposed in the surface of the isolation film and connected to the pixel second conductivity type diffusion region.

5. A semiconductor device according to claim 1; wherein the first conductive type silicon substrate has an etched surface portion disposed in the scribe region.

6. A semiconductor device according to claim 3; wherein the linear image sensor integrated circuit has a passivation film disposed over the surface of the semiconductor wafer except for the etched portion thereof.

7. A linear image sensor integrated circuit comprising: a semiconductor substrate having a pixel region and a scribe region adjacent to the pixel region, a diffusion layer disposed in the pixel region of the semiconductor substrate, a PN junction formed between the semiconductor substrate and the diffusion layer for receiving light, and a passivation film covering the PN junction and disposed over a surface of the semiconductor substrate except for a portion of the surface thereof in the scribe region.

8. An image sensor integrated circuit according to claim 7; further comprising a guard ring disposed in the pixel region of the the semiconductor substrate and spaced-apart from the diffusion layer.

9. An image sensor integrated circuit according to claim 8; wherein the guard ring is not disposed between the PN junction and the scribe region.

* * * * *